United States Patent
Azar

(10) Patent No.: US 6,691,766 B1
(45) Date of Patent: Feb. 17, 2004

(54) CABINET COOLING WITH HEAT PIPE

(75) Inventor: Kaveh Azar, Westwood, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/663,735

(22) Filed: Sep. 15, 2000

(51) Int. Cl.[7] .............................................. F28D 27/00
(52) U.S. Cl. ................ 165/45; 165/104.33; 165/104.34; 62/260; 62/259.2; 312/236
(58) Field of Search .................. 165/45, 104.26, 165/104.33, 104.34, 104.32; 62/260, 259.2; 312/236

(56) References Cited

U.S. PATENT DOCUMENTS

| | | | | |
|---|---|---|---|---|
| 1,265,552 A | * | 5/1918 | Tripp ............................ | 165/45 |
| 3,441,752 A | * | 4/1969 | Grover et al. .......... | 165/104.33 |
| 3,461,952 A | * | 8/1969 | Decker et al. ................. | 165/45 |
| 3,489,203 A | * | 1/1970 | Fischell .................. | 165/184.26 |
| 3,503,025 A | * | 3/1970 | Weinfurt ........................ | 165/45 |
| 3,622,846 A | * | 11/1971 | Kelmers ................. | 165/104.33 |
| 4,564,061 A | * | 1/1986 | Rauth et al. .................... | 115/45 |
| 4,600,050 A | * | 7/1986 | Noren ..................... | 165/104.33 |
| 4,921,039 A | * | 5/1990 | Ghiraldi ................. | 165/104.33 |
| 5,329,425 A | * | 7/1994 | Leyssens et al. ....... | 165/104.33 |
| 5,884,693 A | * | 3/1999 | Austin et al. ........... | 165/104.33 |
| 5,950,710 A | * | 9/1999 | Liu ........................ | 165/104.26 |
| 5,950,712 A | * | 9/1999 | Gates et al. ................... | 165/45 |
| 6,088,225 A | * | 7/2000 | Parry et al. ............. | 165/104.33 |
| 6,104,611 A | * | 8/2000 | Glover et al. ........... | 165/104.33 |
| 6,115,251 A | * | 9/2000 | Patel et al. ............. | 165/184.33 |
| 2002/0036076 A1 | * | 3/2002 | Eastman ....................... | 165/45 |

FOREIGN PATENT DOCUMENTS

| | | | | |
|---|---|---|---|---|
| SU | 480892 | * | 11/1975 | ................... 165/45 |
| SU | 0863959 | * | 9/1981 | ................... 165/45 |

\* cited by examiner

*Primary Examiner*—Christopher Atkinson

(57) ABSTRACT

An electronics cooling system in accordance with the principles of the present invention includes an electronics cabinet that is thermally connected with the ground in the vicinity of the cabinet. The cabinet may or may not sit directly on the earth, but the thermal connection is made with the earth below, and in the near vicinity of, the cabinet, thereby employing the earth as a heat sink. In an illustrative embodiment, an enclosed cabinet includes a heat pipe that makes thermal contact with the ground in the immediate vicinity of the electronics cabinet. An electronics cabinet in accordance with the principles of the present invention is particularly suited for use in uncontrolled environments, such as may be encountered by remote telecommunications switches and wireless telecommunications equipment, for example.

11 Claims, 3 Drawing Sheets

CABINET COOLING WITH HEAT PIPE

FIELD OF THE INVENTION

The invention relates to the cooling of electronic components and, in particular, to the cooling of electronic components housed within an electronics cabinet.

BACKGROUND OF THE INVENTION

The speed of electronic components steadily accelerates and, at the same time, increase in density. Additionally, more components are often placed within a single housing than ever before. All these factors: increased speed of operation, increased density of circuitry within a component, and the increased density of components within a housing, contribute to higher operating temperatures. As the temperature of electronic components increase, their reliability decreases. Heat equals failure and it must be dissipated in order to ensure the proper operation of systems that employ components. Various approaches to the cooling of electronic components have been pursued. Forced fluid cooling is described, for example in, U.S. Pat. No. 4,851,965 issued to Garbuzda et al (Garbuzda), which is hereby incorporated by reference. Garbuzda describes the use of jet impingement of air onto the heat generating component through separate plenums. A circuit pack with inboard jet cooling is described in U.S. Pat. No. 5,067,047 issued to Azar, which is hereby incorporated by reference. It has also been suggested that air can be blown onto the components through holes in the enclosures or shields surrounding the circuit components (see, for example, U.S. Pat. No. 4,393,437 issued to Bell et al and U.S. Pat No. 4,408,255 issued to Adkins, both of which are hereby incorporated by reference. It has been suggested that holes in the circuit boards themselves could allow air to impinge on components in circuit packs which are stacked (see, for example, U.S. Pat. No. 4,399,484 issued to Mayer, which is hereby incorporated by reference).

The cooling of autonomous electronic components, components that are enclosed within a cabinet and that are designed for operation with little human intervention is particularly difficult. Such systems often operate in relatively remote locations and must be extremely reliable. Such autonomous systems are typically exposed to the elements, inasmuch as they are not located within a building of any sort, and, because of their exposure to the elements, they often experience tremendous inflows of heat from their surrounding environment. Coupled with the increasing levels of heat generated by enclosed electronics, and the extreme reliability required for such semi-autonomous operation, the cooling of such systems present a significant challenge.

An electronic cooling system that provides efficient and substantial cooling potential for electronics systems would be highly desirable.

SUMMARY

An electronics cooling system in accordance with the principles of the present invention includes an electronics cabinet that is thermally connected with the ground upon which it sits. The cabinet may or may not sit directly on the earth below, but the thermal connection is made with the earth below, and in the near vicinity of, the cabinet, thereby employing the earth as a heat sink. In an illustrative embodiment; an enclosed cabinet includes a heat pipe that makes thermal contact with the ground in the immediate vicinity of the electronics cabinet. Racks for holding electronic printed circuit cards within the cabinet may be made of high thermal conductivity (that is, at least 40 W/mK) materials, such as Aluminum, Copper, or alloyed materials. Such racks may be mounted to a thermally enhanced frame, that is, a frame of high thermal conductivity material, in such a way as to transfer a substantial portion of thermal energy within the rack to the thermally enhanced frame. Additionally, the thermally enhanced frame may be configured to make similar high conductivity contact with a heat pipe.

The heat pipe, in turn, is connected to conduct heat from the inside of the cabinet to the earth below the cabinet. In addition to conductive thermal transfer from the thermally enhanced frame, the heat pipe may include any of a variety of distributions of finned heat exchangers situated within the cabinet to increase the surface area of the heat pipe exposed to the interior environment of the cabinet. To further enhance heat transfer from the enclosed electronics to the heat pipe, one or more fans may be employed to circulate air within the enclosure. The fan may direct a flow of air to ensure that air heated by the enclosed electronics circulates over a heat exchanger that is in thermal contact with, or a part of, the heat pipe.

An electronics cabinet in accordance with the principles of the present invention is particularly suited for use in uncontrolled environments, such as may be encountered by remote telecommunications switches and wireless telecommunications equipment, for example. In such an application, the exterior surfaced of the cabinet may be thermally reflective and the walls of the enclosure may be insulated to maximize the efficiency of the heat pipe's cooling effects. Additionally, a solar shield may be attached to the exterior of the enclosure to further enhance the effectiveness of the heat pipe. The heat pipe may be distributed in throughout an extensive area beneath the cabinet in order to take further advantage of the thermal mass of the earth.

BRIEF DESCRIPTION OF THE DRAWINGS

The above and fu features, aspects, and advantages of the invention will be apparent to those skilled in the art from the following detailed description, taken together with the accompanying drawings in which.

DETAILED DESCRIPTION

Figure 1:
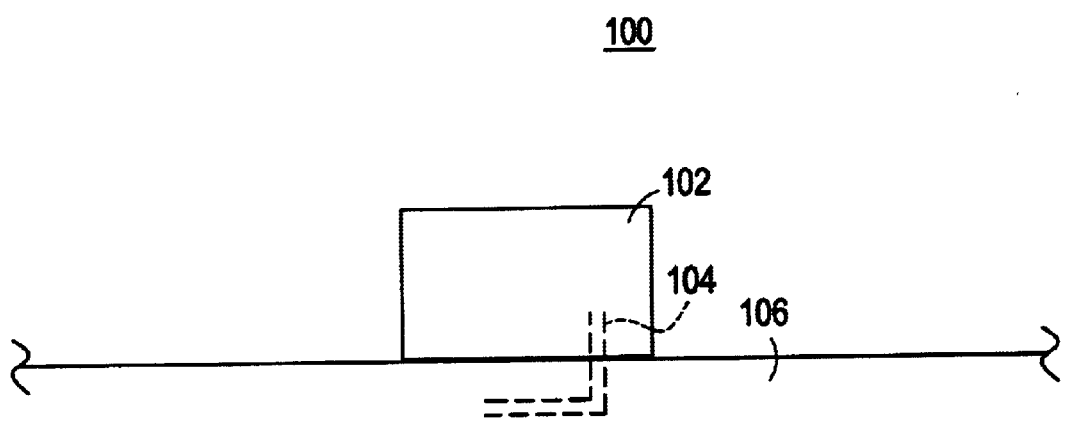
FIG. 1 is conceptual block diagram of an electronics equipment cabinet in accordance with the principles of the present invention.

The conceptual block diagram of FIG. 1 illustrates the components of an electronic cooling system 100 in accordance with the principles of the present invention. The system 100 includes an electronics cabinet 102 that is thermally connected 104 with the ground 106 upon which it sits. The cabinet may or may not sit directly on the earth 106 below, but the thermal connection 104 is made with the earth 106, below and in the near vicinity of, the cabinet. The cabinet thereby employs the earth as a vast heat sink. The thermal connection 104 may be in the form of one or more rods composed of thermally conductive material, such as-Aluminum or Copper. In an illustrative embodiment, the system 100 employs a heat pipe as the thermal connection 104 that makes thermal contact with the ground in the immediate vicinity of the electronics cabinet; Heat pipes are known in the art and are discussed, for example, in U.S. Pat. No. 6,055,157 issued to Bartilson, and U.S. Pat. No. 4,921,041, issued to Akachi, which are hereby incorporated by reference.

Figure 2:
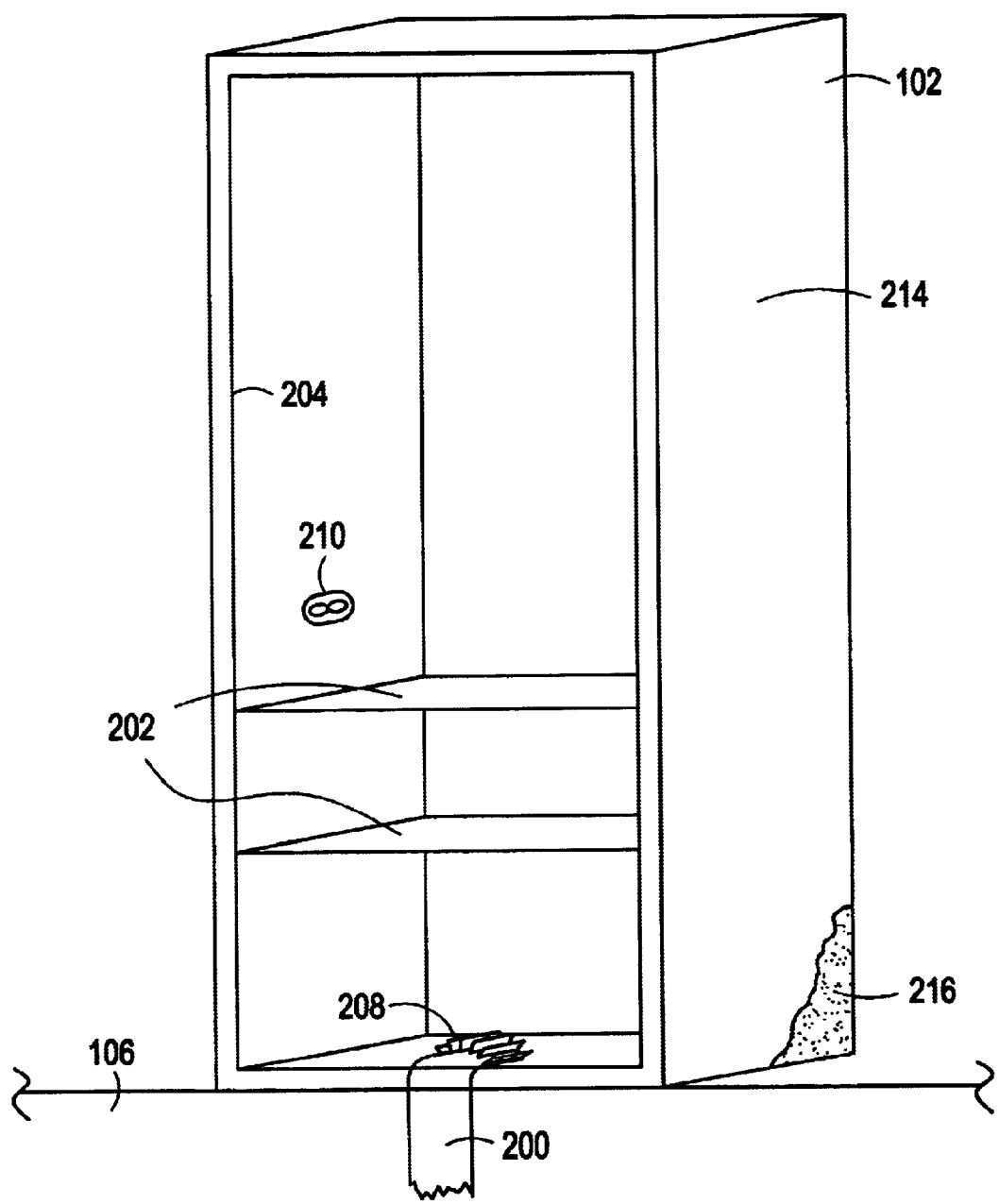
FIG. 2 is a perspective view of an electronics equipment cabinet in accordance with the principles of the present invention.

In the perspective view of FIG. 2 the cooing system 100 includes a cabinet 102 thermally connected to the earth 106 through a heat pipe 200. One or more racks 202 for holding electronic printed circuit cards within the cabinet may be formed of high thermal conductivity materials, such as Aluminum, Copper, or alloyed materials. The racks 202 maybe mounted to a thermally enhanced frame 204. The frame 204 is also composed of high thermal conductivity material, and the racks 202 may be attached to the frame 204 in such a way as to transfer a substantial portion of the thermal energy from a rack 202 to the thermally enhanced frame 204. Such thermal attachments are known and may include the use of broad areas of thermally conductive contact between a rack 202 and the frame 204. Thermal "greases" may also be employed to enhance the conductivity between a rack 202 and the frame 204. Similarly, the thermally enhanced frame 204 may be configured to make high conductivity contact with the heat pipe 200. The heat pipe 200, which may extend substantially within and-throughout the interior of the cabinet 102, and, is connected to conduct heat from the inside of the cabinet 102 to the earth 106 outside. If the cabinet is suspended above the ground, the section of exposed heat pipe 206 may be insulated to shield it from radiant, convective, or other heat sources in the environment surrounding the cabinet 102.

In addition to conductive thermal transfer from the thermally enhanced frame 204, the heat pipe 200 may include a heat exchanger 208, such as a finned heat exchanger as is known in the art, situated within the cabinet to increase the surface area of the heat pipe 206 exposed to the interior environment of the cabinet. To further enhance heat transfer from the enclosed electronics (not shown, but housed in the racks 202) to the heat pipe 206, one or more fans 210 may be employed to circulate air within the enclosure. The fan 210 may direct a flow of air to ensure that air heated by the enclosed electronics circulates over the heat exchanger 208 that is in thermal contact with, or is an integral part of, the heat pipe 206. The heat pipe 206 may take on any of the myriad known shapes and configurations of heat pipes and may be distributed over a substantial area in the ground 106 around the cabinet 102.

An electronics cooling system 100 in accordance with the principles of the present invention is particularly suited for use in uncontrolled environments, such as may be encountered by remote telecommunications switches and wireless telecommunications equipment, for example. In such an application, the exterior surfaces of the cabinet may be thermally reflective 214 and the walls of the enclosure may be insulated 216 to maximize the efficacy of the heat pipe's cooling effects. Additionally, a solar shield 218 may be attached to the exterior of the enclosure to further enhance the effectiveness of the heat pipe.

Figure 3:
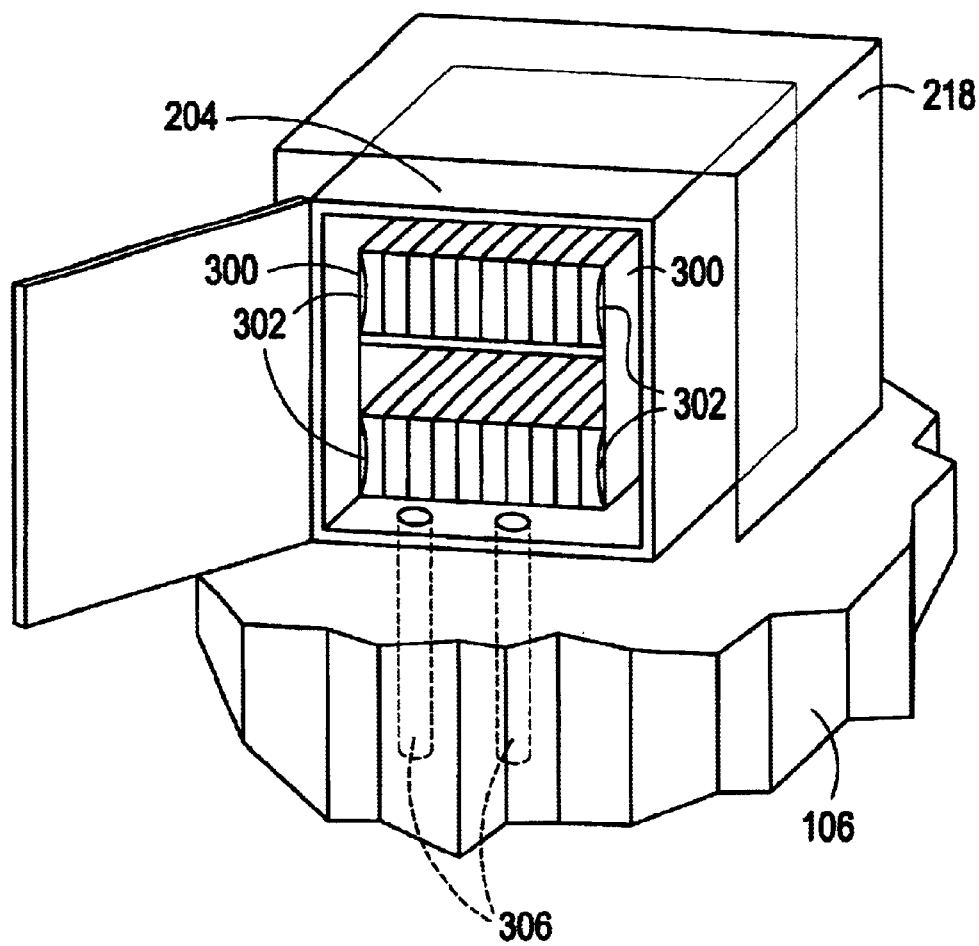
FIG. 3 is a more detailed perspective view of an electronics cabinet in accordance with the principle of the present invention.

The perspective view of FIG. 3 illustrates an electronics cabinet 204 that includes a thermally enhanced frame 300 for housing electronics racks 202. The frame 300 may be made of a high thermal conductivity material (that is, at least 40 W/mk), such as copper or a copper alloy, for example. The frame is thermally coupled 302 to the card racks 202 in order to provide a path of high thermal conductivity from the electronics racks 202 to the frame 300. The thermal coupling could be effected by ensuring a conforming fit between the racks 202 and the frame and firmly attaching the racks 202 to the frame with a large area of thermally conductive contact between the racks 202 and the frame. The thermal coupling may include a thermally conductive gap filler or thermal grease, such as is available from Chomerics Inc. of Wobum, Mass. The frame 300 may make direct contact with the heat pipe 306, again, in order to further enhance conductive heat flow from the racks 202 to the heat pipe 306.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. A cooling system for electronics in a location with access to the ground comprising:

an enclosed cabinet;

a thermally enhanced frame located within the cabinet;

one or more racks for holding electronics supported by and attached to the frame through high thermal conductivity attachment means;

a heat pipe disposed with a bottom interior of the cabinet and in thermal contact with the thermally enhanced frame, the heat pipe extending vertically from the interior of the cabinet into the ground, wherein the heat pipe does not directly contact the one or more racks or the high thermal conductivity attachment means; and a solar shield attached to the exterior of the cabinet, thereby shielding the cabinet from insolation.

2. The cooling system of clam 1 further comprising a fan positioned within the cabinet to circulate air across the heat pipe.

3. The cooling system of claim 2 wherein the heat pipe includes a heat exchanger.

4. The cooling system of claim 3 wherein the exterior surface of the cabinet is thermally reflective.

5. A method of cooling electronics in a location with access to the ground comprising the steps of:

(A) enclosing the electronics within a cabinet;

(B) forming a thermally enhanced frame within the cabinet;

(C) attaching one or more racks made of high thermal conductivity material to the frame through high thermal conductivity attachment means;

(D) connecting a heat pipe from the interior of the cabinet into the ground in the vicinity of the cabinet and to the thermally enhanced frame, a conductive thermal connection between the heat pipe and the one or more racks and the high thermal conductivity attachment means being provided only through the thermally enhanced frame; and (E) providing a solar shield to the cabinet to shield the cabinet from insolation.

6. The method of claim 5 further comprising the step of:

operating a fan positioned within the cabinet to circulate air across the heat pipe.

7. The method of claim 6 further comprising the step of:

positioning the fan to circulate air across a heat exchanger attached to the heat pipe.

8. A cooling system from electronics in a location with access to the ground comprising:
   an enclosed cabinet;
   a heat pipe disposed within a bottom interior of the cabinet, wherein the heat pipe extends vertically from the interior of the cabinet into the ground;
   at least one rack for holding electronic circuit cards, the at least one rack composed of a high thermal conductivity material; and
   a thermally enhanced frame disposed within the cabinet and configured to support the at least one rack, wherein the enhanced frame is attached to the at least one rack through a first high thermal conductivity connection, the thermally enhanced frame is attached to the heat pipe through a second high thermal conductivity connection, and further wherein the heat pipe does not directly contact the one or more racks or the first high thermal conductivity connection.

9. The cooling system of claim 8 wherein the thermal conductivity of the thermally enhanced frame is at least 40 W/mk.

10. The cooling system of claim 8 further comprising a fan positioned within the cabinet to circulate air across the heat pipe.

11. The cooling system of claim 8 wherein the heat pipe includes a heat exchanger.

* * * * *